(12) United States Patent
Camillo-Castillo et al.

(10) Patent No.: US 9,070,734 B2
(45) Date of Patent: Jun. 30, 2015

(54) HETEROJUNCTION BIPOLAR TRANSISTORS WITH REDUCED PARASITIC CAPACITANCE

(71) Applicant: International Business Machines Corporation, Armonk, NY (US)

(72) Inventors: Renata Camillo-Castillo, Essex Junction, VT (US); Vibhor Jain, Essex Junction, VT (US); Vikas K. Kaushal, Essex Junction, VT (US); Marwan H. Khater, Astoria, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/528,388

(22) Filed: Oct. 30, 2014

(65) Prior Publication Data

US 2015/0053982 A1    Feb. 26, 2015

Related U.S. Application Data

(62) Division of application No. 13/955,382, filed on Jul. 31, 2013, now Pat. No. 8,957,456.

(51) Int. Cl.
*H01L 29/66* (2006.01)
*H01L 27/082* (2006.01)
*H01L 21/331* (2006.01)
*H01L 29/737* (2006.01)
*H01L 29/10* (2006.01)
*H01L 29/08* (2006.01)

(52) U.S. Cl.
CPC .......... *H01L 29/737* (2013.01); *H01L 29/1004* (2013.01); *H01L 29/0817* (2013.01); *H01L 29/0821* (2013.01)

(58) Field of Classification Search
CPC .............. H01L 29/7371; H01L 29/66318; H01L 29/66242; H01L 29/7378; H01L 29/1004
USPC .......... 257/197, 565, 571, E29.174; 438/205, 438/309
See application file for complete search history.

(56) References Cited

U.S. PATENT DOCUMENTS 5,783,966 A   7/1998  Hill et al.
5,827,154 A   10/1998 Gill
6,656,811 B2  12/2003 Swanson et al.
(Continued)

OTHER PUBLICATIONS

D Tran, Examiner, USPTO, Notice of Allowance issued in U.S. Appl. No. 13/955,382 dated Oct. 3, 2014.

*Primary Examiner* — Long K Tran
*Assistant Examiner* — Dzung Tran
(74) *Attorney, Agent, or Firm* — Wood, Herron & Evans, LLP; Anthony J. Canale

(57) ABSTRACT

Fabrication methods, device structures, and design structures for a heterojunction bipolar transistor. A trench isolation region and a collector are formed in a semiconductor substrate. The collector is coextensive with the trench isolation region. A first semiconductor layer is formed that includes a of single crystal section disposed on the collector and on the trench isolation region. A second semiconductor layer is formed that includes a single crystal section disposed on the single crystal section of the first semiconductor layer and that has an outer edge that overlies the trench isolation region. The section of the first semiconductor layer has a second width greater than a first width of the collector. The section of the second semiconductor layer has a third width greater than the second width. A cavity extends laterally from the outer edge of section of the second semiconductor layer to the section of the first semiconductor layer.

11 Claims, 12 Drawing Sheets

(56) References Cited

U.S. PATENT DOCUMENTS

| | | |
|---|---|---|
| 6,940,149 B1 | 9/2005 | Divakaruni et al. |
| 6,964,907 B1 | 11/2005 | Hopper et al. |
| 7,190,046 B2 | 3/2007 | Akatsu et al. |
| 7,462,923 B1 | 12/2008 | U'Ren |
| 7,816,221 B2 | 10/2010 | John et al. |
| 8,067,290 B2 | 11/2011 | Boeck et al. |

HETEROJUNCTION BIPOLAR TRANSISTORS WITH REDUCED PARASITIC CAPACITANCE

BACKGROUND

The invention relates generally to semiconductor device fabrication and, in particular, to heterojunction bipolar transistors, fabrication methods for a heterojunction bipolar transistor, and design structures for a heterojunction bipolar transistor.

Bipolar junction transistors are typically found in demanding types of integrated circuits, especially integrated circuits destined for high-frequency and high-power applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors constitute three-terminal electronic devices constituted by three semiconductor regions, namely an emitter, an intrinsic base, and a collector. Heterojunction bipolar transistors are a variant of bipolar junction transistors in which at least two of the collector, emitter, and intrinsic base are comprised of differing semiconductor materials. An NPN bipolar junction transistor includes two regions of n-type semiconductor material constituting the emitter and collector, and a region of p-type semiconductor material sandwiched between the two regions of n-type semiconductor material to constitute the intrinsic base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Improved device structures, fabrication methods, and design structures are needed that enhance the device performance of heterojunction bipolar transistors.

SUMMARY

In an embodiment of the invention, a method is provided for forming a device structure for a heterojunction bipolar transistor. The method includes forming a first semiconductor layer including a first section disposed on a collector and on a trench isolation region coextensive with the collector. A second semiconductor layer is formed that includes a first section disposed on the first section of the first semiconductor layer and that has an outer edge that overlies the trench isolation region. The method further includes removing a second section of the first semiconductor layer from between the first section of the second semiconductor layer and the trench isolation region to define a cavity extending laterally from the outer edge of the first section of the second semiconductor layer to the first section of the first semiconductor layer. The first section of the first semiconductor layer is comprised of a first single crystal semiconductor material and the first section of the second semiconductor layer is comprised of a second single crystal semiconductor material. The collector has a first width, the first section of the first semiconductor layer has a second width greater than the first width, and the first section of the second semiconductor layer has a third width greater than the second width.

In an embodiment of the invention, a device structure is provided for a heterojunction bipolar transistor. The device structure includes a trench isolation region in a semiconductor substrate, a collector in the semiconductor substrate and coextensive with the trench isolation region, a first semiconductor layer including a section disposed on the collector and on the trench isolation region, and a second semiconductor layer including a section disposed on the section of the first semiconductor layer. The section of the first semiconductor layer and the section of the second semiconductor layer are comprised of respective first and second single crystal semiconductor materials. The collector has a first width, the section of the first semiconductor layer has a second width greater than the first width, and the section of the second semiconductor layer has a third width greater than the second width. The section of the second semiconductor layer has an outer edge that overlies the trench isolation region. A cavity extends laterally beneath the section of the second semiconductor layer from the outer edge of the section of the second semiconductor layer to the section of the first semiconductor layer.

According to another embodiment of the present invention, a design structure is provided that is readable by a machine used in design, manufacture, or simulation of an integrated circuit. The design structure includes a trench isolation region in a semiconductor substrate, a collector in the semiconductor substrate and coextensive with the trench isolation region, a first semiconductor layer including a section disposed on the collector and on the trench isolation region, and a second semiconductor layer including a section disposed on the section of the first semiconductor layer. The section of the first semiconductor layer and the section of the second semiconductor layer are comprised of respective first and second single crystal semiconductor materials. The collector has a first width, the section of the first semiconductor layer has a second width greater than the first width, and the section of the second semiconductor layer has a third width greater than the second width. The section of the second semiconductor layer has an outer edge that overlies the trench isolation region. A cavity extends laterally beneath the section of the second semiconductor layer from the outer edge of the section of the second semiconductor layer to the section of the first semiconductor layer. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
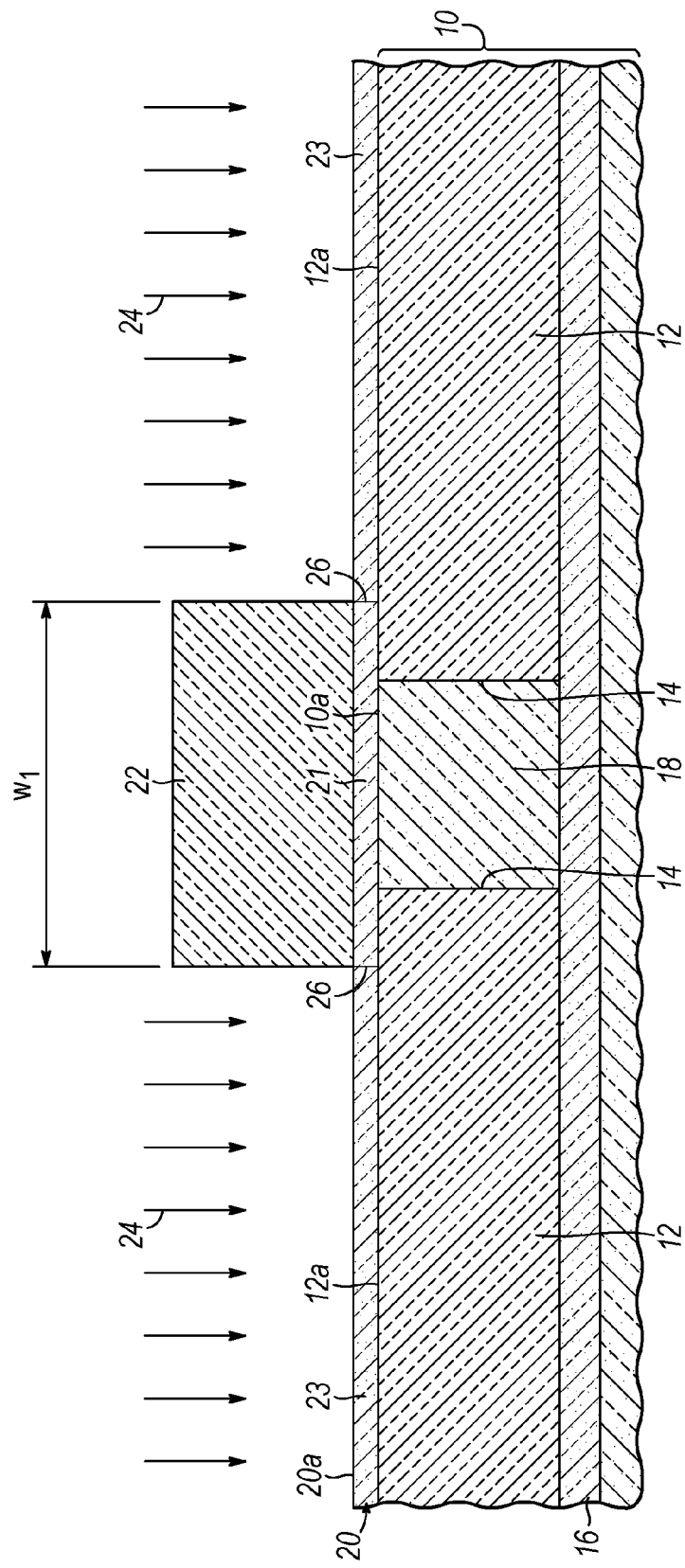
FIGS. 1-7 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single crystal semiconductor material usable to form an integrated circuit. For example, substrate 10 may be comprised of a bulk wafer of a monocrystalline silicon-containing material, such as single crystal silicon with a (100) crystal lattice orientation, or a device layer of a silicon-on-insulator (SOI) wafer. The semiconductor material comprising substrate 10 may be lightly doped with an impurity to alter its electrical properties and may also include an optional epitaxial layer.

Trench isolation regions 12 include sidewalls 14 that circumscribe and are coextensive with a collector 18. The trench isolation regions 12 may be isolation regions formed by a shallow trench isolation (STI) technique that relies on a lithography and dry etching process to define trenches in substrate 10, deposits an electrical insulator to fill the trenches, and planarizes the electrical insulator relative to the top surface 10a of the substrate 10 using a chemical mechanical polishing (CMP) process. The electrical insulator may be comprised of an oxide of silicon, such as tetraethylorthosilicate (TEOS) deposited by chemical vapor deposition (CVD). A top surface 12a of the trench isolation regions 12 may be nominally coplanar with the top surface 10a of the substrate 10.

The collector 18 is an impurity-doped region defined in the substrate 10. A top surface of the collector 18 may be coextensive with the top surface 10a of substrate 10. The sidewalls 14 represent interior surfaces of the trench isolation regions 12 that are coextensive with the collector 18. The collector 18 may be formed by introducing an electrically-active dopant, such as an impurity species from Group V of the Periodic Table (e.g., phosphorus (P), arsenic (As), or antimony (Sb)) effective to impart n-type conductivity in the host semiconductor material. In one embodiment, the collector 18 may be formed by ion implantation of the n-type impurity species and, thereafter, annealing to electrically activate the impurity species and to alleviate implantation damage. A subcollector 16 in the substrate 10 may underlie the collector 18 and furnish structure used to contact the collector 18. The subcollector 16 comprises semiconductor material of the same conductivity type as the collector 18 and is electrically continuous with the collector 18.

The top surface 10a of substrate 10 may be cleaned to, for example, remove native oxide. The cleaning process may be a wet chemical etching process using either dilute hydrofluoric (DHF) or buffered hydrofluoric (BHF), or a dry process, such as chemical oxide removal (COR).

A blanket layer 20 comprised of a semiconductor material is deposited on the cleaned top surface 10a of the substrate 10 and on a top surface 12a of the trench isolation regions 12. The semiconductor material in layer 20 may be comprised of a non-single crystal semiconductor material, such as polycrystalline semiconductor material or amorphous semiconductor material. In one embodiment, the semiconductor material in layer 20 may be comprised of polycrystalline silicon (polysilicon) deposited using rapid thermal chemical vapor deposition (RTCVD) and silane ($SiH_4$) as a source gas. In another embodiment, the semiconductor material in layer 20 may be comprised of amorphous silicon deposited using plasma-enhanced chemical vapor deposition (PECVD) or low-pressure chemical vapor deposition (LPCVD).

A mask 22 is formed on a top surface 20a of layer 20. The mask 22 covers a section 21 of layer 20 that is coextensive with the collector 18, but wider than the collector 18. The mask 22 may be comprised of a layer of sacrificial material that is applied and photolithographically patterned, and for which the thickness is selected to stop implanted ions from reaching the masked section 21 of layer 20. To that end, the sacrificial layer may be comprised of a photoresist that is applied by a spin coating process, pre-baked, exposed to a radiation projected through a photomask, baked after exposure, and developed with a chemical developer to form the mask 22.

Energetic ions, as indicated by the single-headed arrows 24, are introduced using ion implantation into a section 23 of layer 20 unmasked by mask 22. The kinetic energy of the ions 24 may be selected to provide a projected range and a range straggle confined within the thickness of layer 20. Essentially all of the implanted ions 24 stop within a distance of about three times the range straggle from the projected range. The implanted dose and type of ions 24 may be selected to promote an etch rate difference as discussed below relative to the masked section 21 that is not implanted. In one embodiment, the ions 24 may be germanium ions generated from a source gas containing germanium (Ge) and the germanium concentration of section 23 may be greater than 1 atomic percent.

The implanted section 23 of layer 20 overlies the trench isolation regions 12 such that section 23 is wider and longer than the width and length of the collector 18. The sections 21, 23 join along an edge 26 that is vertically aligned with the edge of the mask 22. The masked section 21 has a width, $w_1$, measured relative to edge 26. The composition of the implanted section 23 differs from the composition of the non-implanted section 21. The mask 22 operates as an ion-implantation mask that protects the masked section 21 against receiving an implanted dose of the ions 24. The mask 22 is removed after the section 23 of altered composition is defined. If comprised of a photoresist, the mask 22 may be removed by ashing or solvent stripping, followed by surface cleaning.

Figure 2:
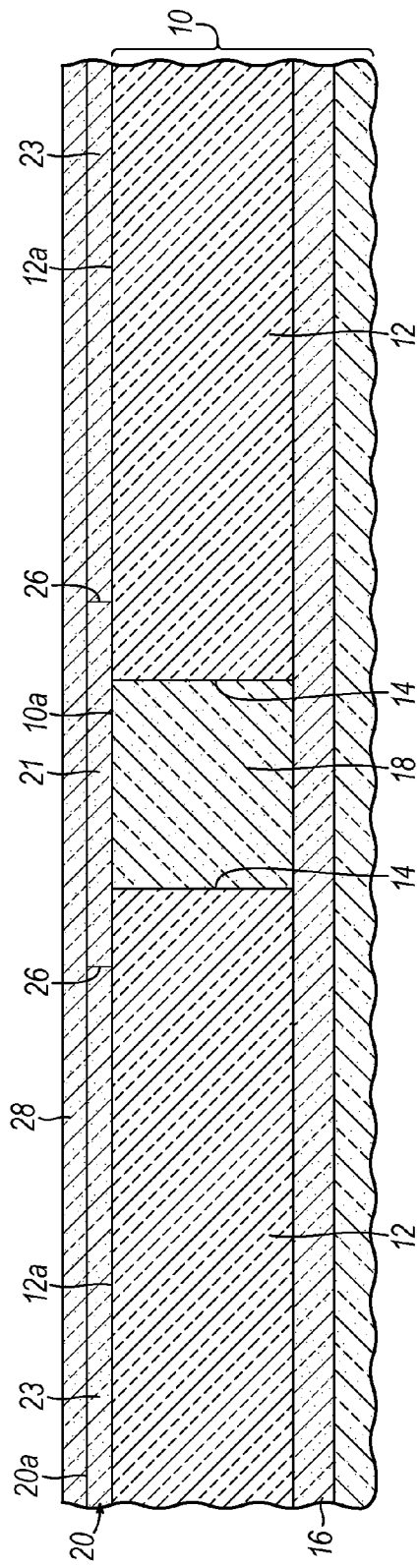

With reference to FIG. 2 in which like reference numerals refer to like features in FIG. 1 and at a subsequent fabrication stage of the processing method, a blanket layer 28 comprised of a semiconductor material is deposited on the top surface 20a of layer 20. The semiconductor material in layer 28 may be comprised of a non-single crystal semiconductor material, such as polycrystalline semiconductor material or amorphous semiconductor material. The semiconductor material in layer 28 may be comprised of polysilicon deposited using RTCVD, or may be comprised of amorphous silicon deposited using PECVD or LPCVD.

Figure 3:
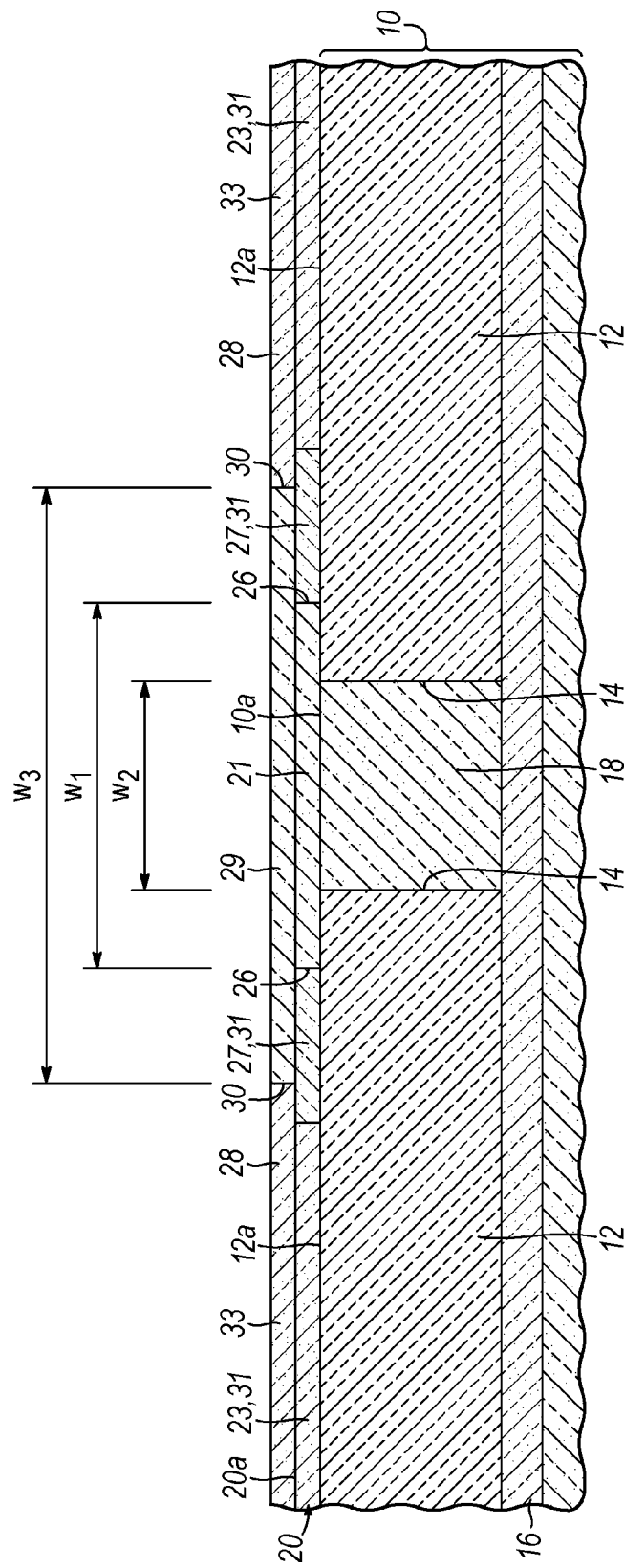

With reference to FIG. 3 in which like reference numerals refer to like features in FIG. 2 and at a subsequent fabrication stage of the processing method, a thermal anneal is used to realign, e.g., regrow or crystallize, section 21 of the semiconductor material of layer 20, a portion 27 of implanted section 23 of layer 20, and a section 29 of layer 28. The section 21 has an epitaxial relationship with the semiconductor material of the substrate 10 and section 29 has an epitaxial relationship with the semiconductor material of section 21. In the alignment process, the single crystal section 21 of layer 20 is in direct contact with the top surface 10a of the substrate 10 and acquires the crystal structure and orientation of the single crystal semiconductor material of substrate 10. The single crystal semiconductor material of the substrate 10 operates as a growth seed for crystalline realignment of the non-single crystal semiconductor material of layer 20 to form section 21. Similarly, in the alignment process, the single crystal section 29 of layer 28 is in direct contact with the top surface 21a of the single crystal section 21 and acquires the crystal structure and orientation of the single crystal semiconductor material of the single crystal section 21. The single crystal semiconductor material of the single crystal section 21 operates as a growth seed for crystalline realignment of the non-single crystal semiconductor material of layer 28 to form section 29. The epitaxial growth may be isotropic so that the single crystal regions 21, 29 are centered about a vertical centerline of the collector 18.

The regrown portion 27 of implanted section 23 of layer 20 may comprise polycrystalline semiconductor material. A non-single crystal portion 31 of the implanted section 23 of layer 20 is not regrown and consists of its constituent semiconductor material in the implanted state.

The thermal anneal may employ conditions (e.g., time, temperature) sufficient to regrow the single crystal section 29 with designated dimensions. The single crystal section 29 of layer 28 joins a non-single crystal section 33 of layer 28 at an edge 30, which defines a perimeter of single crystal section 29. The dimensions of the single crystal section 21 are determined based upon the location of the edge 26 at the junction of the implanted section 23 and non-implanted section 21 of layer 20. The edge 26, which defines a perimeter of single crystal section 21, is preserved at the junction of single crystal section 21 and the regrown portion 27 of implanted section 23 of layer 20. Representative thermal annealing conditions include, but are not limited to, a two-hour anneal at 600° C. or a fifteen-minute anneal at 900° C. with lower temperatures requiring longer time to provide the same lateral extent of realignment.

The thermal anneal conditions are controlled such that the edge 30 overlies the top surface 12a of trench isolation regions 12 and projects laterally outward beyond the edge 26 of layer 28 and the sidewalls 14 of trench isolation regions 12. Specifically, the lateral dimensions of the single crystal section 29 are larger than the lateral dimensions of the single crystal section 21. The regrown portion 27 of implanted section 23 of layer 20 is located between an outer portion of single crystal section 29 and the top surface 12a of the trench isolation regions 12. An inner portion of single crystal section 29 of layer 28 is separated from the collector 18 and the top surface 12a of the trench isolation regions 12 by the single crystal section 21 of layer 20.

The width, $w_1$, of single crystal section 21 is greater than a width, $w_2$, of the collector 18 at top surface 10a. Similarly, the length of the single crystal section 21 is greater than the length of the collector 18 at top surface 10a in a direction not visible in FIG. 3. The width, $w_2$, and/or length of the collector 18 may be referenced relative to the sidewalls 14 of the trench isolation regions 12. Hence, the dimensions (length and width) of the single crystal section 21 are larger than the dimensions (length and width) of the collector 18 when viewed from a perspective normal to the top surface 10a. The dimensional difference (e.g., the difference in the widths and lengths) defines the extent of the overlap of the single crystal section 21 of layer 20 with the top surface 12a of trench isolation regions 12.

The single crystal section 29 has a width, $w_3$, measured relative to edge 30 that is greater than the width, $w_1$, of single crystal section 21. Similarly, the length of the single crystal section 29 is greater than the length of the single crystal section 21 in a direction not visible in FIG. 3. Hence, the dimensions (length and width) of the single crystal section 29 are larger than the underlying dimensions (length and width) of the single crystal section 21 when viewed from a perspective normal to the top surface 10a. The dimensional difference (e.g., the difference in the widths and lengths) defines the extent of the overlap of the single crystal section 29 of layer 28 with layer 20 outside of the single crystal section 21. In the representative embodiment, the single crystal section 29 of layer 28 overlaps with the regrown portion 27 of the implanted section 23 of layer 20.

The dimensions (i.e., widths $w_1$, $w_3$ and the lengths) of the single crystal sections 21, 29 can be adjusted through the annealing conditions employed in the regrowth of the single crystal sections 21, 29.

Figure 4:
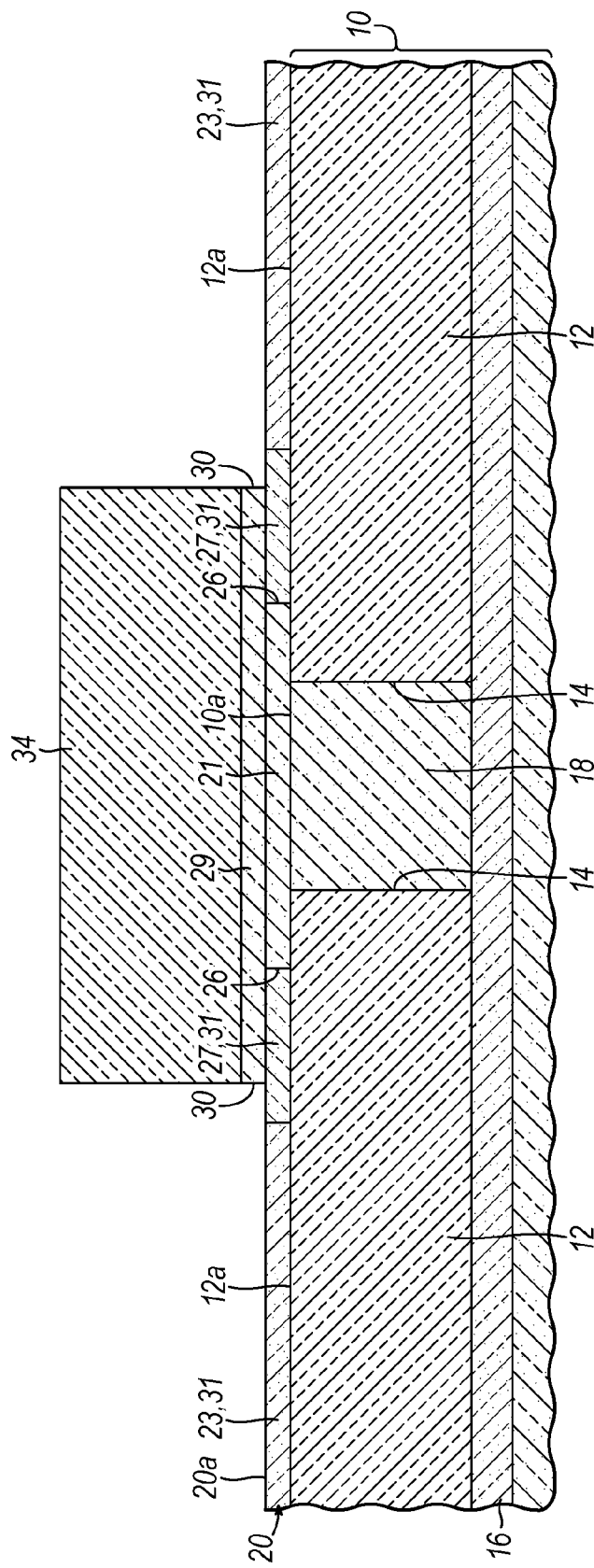

With reference to FIG. 4 in which like reference numerals refer to like features in FIG. 3 and at a subsequent fabrication stage of the processing method, a mask 34 is formed on a top surface 28a of layer 28. The mask 34 covers all or a majority of the section 29 of layer 28. In the representative embodiment, the outer edge of the mask 34 coincides with the edge 30 at the perimeter of single crystal section 29 of layer 28. The mask 34 may be comprised of a layer of sacrificial material that is applied and photolithographically patterned. To that end, the sacrificial layer may be comprised of a photoresist that is applied by a spin coating process, pre-baked, exposed to a radiation projected through a photomask, baked after exposure, and developed with a chemical developer to form the mask 34.

Layer 28 is etched with either a wet or dry etch process to remove the semiconductor material of the non-single crystal section 33 of layer 28. In one embodiment, a reactive ion etch (RIE) may be used to remove the non-single crystal section 33 of layer 28. The etch process is selected to remove the semiconductor material of layer 28 selective to the semiconductor material of layer 20. The remnant of layer 28 comprises the single crystal section 29, which terminates at the edge 30.

Figure 5:
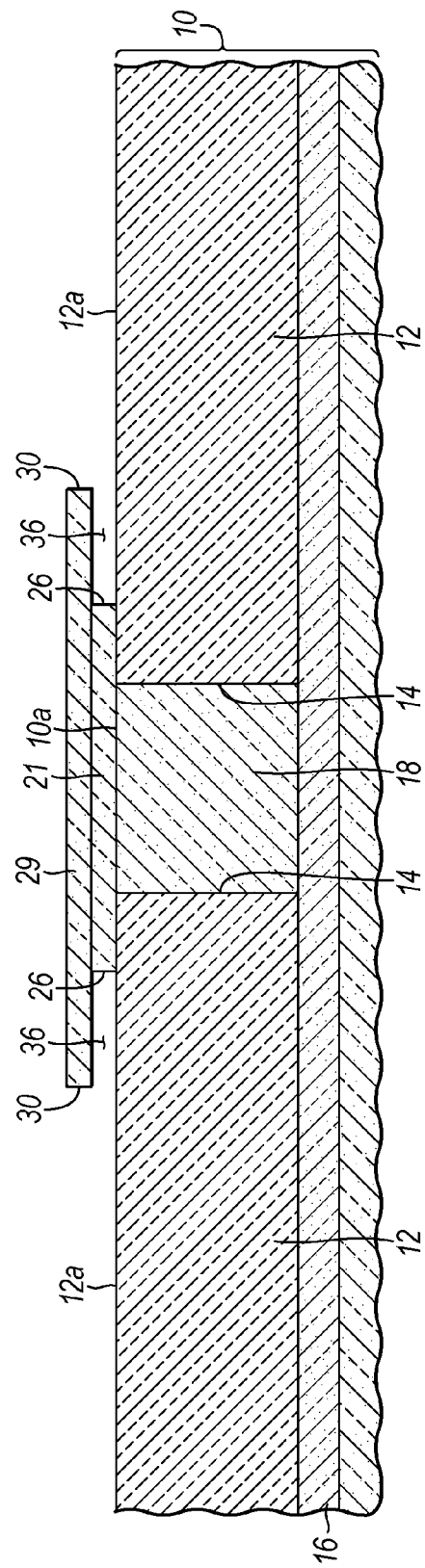

With reference to FIG. 5 in which like reference numerals refer to like features in FIG. 4 and at a subsequent fabrication stage of the processing method, the mask 34 is then removed. If comprised of a photoresist, the mask 34 may be removed by ashing or solvent stripping, followed by surface cleaning.

A wet chemical etching process may be utilized to remove the semiconductor materials of the non-single crystal portion 31 of layer 20 and the regrown portion 27 of implanted section 23 of layer 20 selective to the single crystal section 29 of layer 28 and the single crystal section 21 of layer 20. In one embodiment, the wet chemical etching process comprises an isotropic etching process that removes the semiconductor materials of the non-single crystal portion 31 of layer 20 and the regrown portion 27 of implanted section 23 of layer 20. The single crystal section 21 represents the remnant of layer 20 and terminates at the edge 26. The concentration of the element introduced into the implanted section 23 of layer 20 is effective to provide non-single crystal portion 31 of layer 20 and the regrown portion 27 of implanted section 23 of layer 20 with respective etch rates greater than an etch rate of the single crystal section 21 of the layer 20 and greater than an etch rate of the single crystal section 29 of the layer 28.

A cavity 36 is defined between the single crystal section 29 of layer 28 and the single crystal section 21 of layer 20, and is unfilled by solid material. The cavity 36 starts at the edge 30 of single crystal section 29 and terminates at the edge 26 of single crystal section 21. The extent of the undercut beneath the single crystal section 29 is determined by the relative locations of the edges 26, 30. The dimensions (i.e., the length and width) of the cavity 36 are determined by the difference in the corresponding dimensions of the single crystal sections 21, 29. For example, the width of the cavity 36 are determined by the difference between the width, $w_3$, of single crystal section 29 and the width, $w_1$, of single crystal section 21 (i.e., the distance separating the edges 26, 30). In an embodiment, the dimensions and extent of the undercut may be symmetrical about a centerline the collector 18 due to a similar symmetry of the regrown portion 27 of implanted section 23 of layer 20 that is removed. The height of the cavity 36 will be determined primarily by the thickness of the layer 20. The dimensions and height of the cavity 36 are tunable based upon the extent of the regrowth of layers 20, 28 and the thickness of layer 20, and the height may be uniform as a function of position in a plane defined by the cavity length and width.

The cavity 36 may define an air gap with an effective dielectric constant of near unity (about 1.0). The cavity 36 may be filled by air at or near atmospheric pressure, filled by another gas at or near atmospheric pressure, or contain air or gas at a sub-atmospheric pressure (e.g., a partial vacuum).

In an alternative embodiment, the reactive ion etch performed in connection with FIG. 4 to remove the non-single crystal section 33 of layer 28 may be non-selective, in which case the non-single crystal portion 31 of layer 20 and part of the regrown portion 27 of implanted section 23 of layer 20 are etched along the edge 30. A wet chemical etching process may be utilized to remove the semiconductor material of the regrown portion 27 of implanted section 23 of layer 20 selective to the single crystal section 29 of layer 28 and the single crystal section 21 of layer 20 to define cavity 36 as in FIG. 5.

Figure 6:
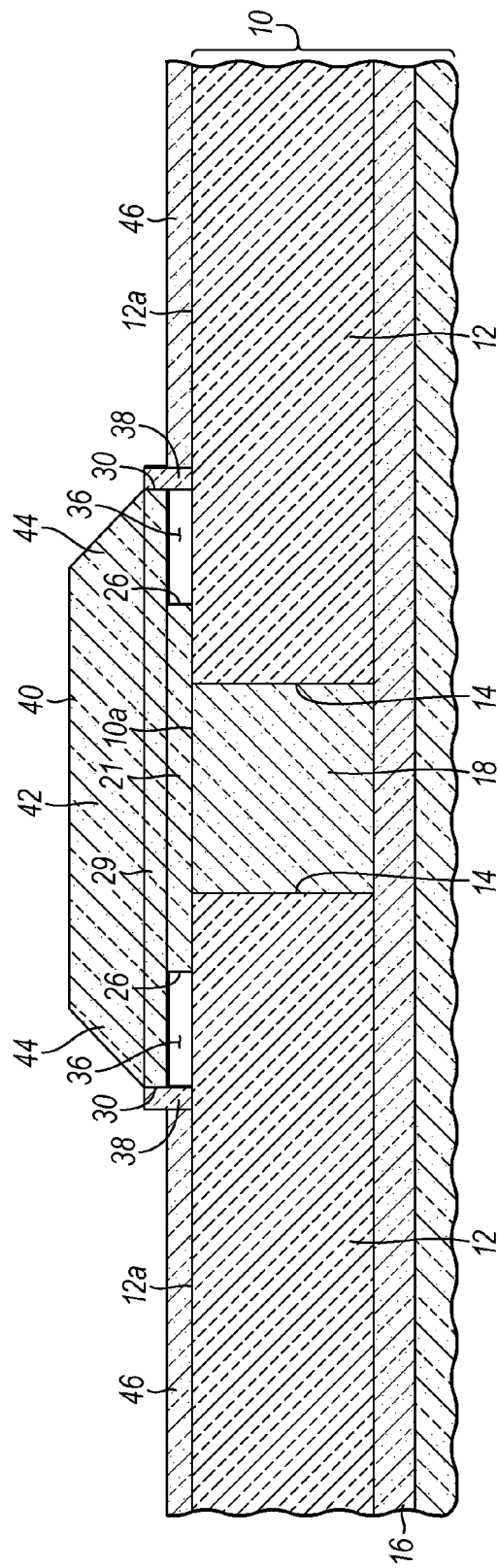

With reference to FIG. 6 in which like reference numerals refer to like features in FIG. 5 and at a subsequent fabrication stage of the processing method, at least one spacer 38 is formed at a periphery of the single crystal section 29 of the second layer 28 and has dimensions (e.g., height and thickness) configured to close an entrance to the cavity 36. Each spacer 38 may extend vertically upward from the top surface 12a of trench isolation regions 12 to the edge 30 bounding the single crystal section 29 of layer 28. The at least one spacer 38 may be formed by depositing a conformal layer comprised of an electrical insulator, such as silicon nitride ($Si_3N_4$) deposited by CVD, and shaping the conformal layer with an anisotropic etching process, such as RIE, that preferentially removes the electrical insulator from horizontal surfaces.

An intrinsic base layer 40, which is comprised of a material suitable for forming an intrinsic base of a heterojunction bipolar transistor, is formed as a continuous additive layer on the single crystal section 29 of layer 28. The intrinsic base layer 40 includes a single crystal section 42 positioned in vertical alignment with the single crystal section 29 of layer 28 and that directly contacts the single crystal section 29 of layer 28. The intrinsic base layer 40 further includes facets 44 that terminate at a location nominally coinciding with (i.e., coterminous with) the location of the edge 30 and that surround the single crystal section 42. Due to this conterminous relationship, the width of the single crystal section 42 and the facets 44 of the intrinsic base layer 40 is approximately equal to the width, $w_3$, of single crystal section 29 of layer 28. The single crystal section 42 of intrinsic base layer 40 is coupled by the single crystal section 21 of layer 20 and the single crystal section 29 of layer 28 with the collector 18.

The intrinsic base layer 40 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 40 may be uniform or the germanium content of intrinsic base layer 40 may be graded and/or stepped across the thickness of intrinsic base layer 40. If the germanium content is stepped, a thickness of the intrinsic base layer 40, such as a thickness directly contacting layer 28, may not contain any germanium and may be entirely comprised of silicon (Si). The intrinsic base layer 40 may be doped with one or more impurity species, such as boron or phosphorus either with or without carbon.

Intrinsic base layer 40 may be formed using a low temperature epitaxial (LTE) growth process, such as vapor phase epitaxy (VPE) that may be conducted at a growth temperature ranging from 400° C. to 850° C. Single crystal semiconductor material (e.g., single crystal silicon and/or single crystal SiGe) epitaxially grows in single crystal section 42 disposed on the single crystal section 29 of layer 28. The crystal structure of single crystal semiconductor material of the single crystal section 29 serves as a crystalline template for the growth of the crystal structure of the single crystal section 42 of intrinsic base layer 40. The facets 44 of intrinsic base layer 40 may comprise a mixture of polycrystalline and single crystal semiconductor material. The at least one spacer 38 occludes the entrance to the cavity 36 so that the semiconductor material of the intrinsic base layer 40 does not infiltrate into the cavity 36 during the epitaxial growth process.

A field region 46 of the intrinsic base layer 40 forms on the top surface 12a of trench isolation regions 12. The field region 46 may comprise polycrystalline semiconductor material as the dielectric material of the trench isolation regions 12 is unable to serve as a growth template. The field region 46 is thinner than the single crystal section 42 and the at least one spacer 38 is positioned between the single crystal section 42 and field region 46. In an embodiment, the field region 46 of the intrinsic base layer 40 may cooperate with each spacer 38 to occlude the entrance to the cavity 36 after the epitaxial growth process. The single crystal section 42 and field region 46 of intrinsic base layer 40 are discontinuous and are disposed in different planes relative to the top surface 10a of substrate 10. In particular, the single crystal section 42 is raised relative to the field region 46.

In an alternative, embodiment, the intrinsic base layer 40 may be grown using a selective epitaxial growth (SEG) process such that only the single crystal section 42 and facets 44 are formed, but the field region 46 is absent. In this instance, the intrinsic base layer 40 does not participate in occluding the entrance to the cavity 36 following epitaxial growth.

The dimensions (length and width) of the single crystal section 42 and facets 44 of intrinsic base layer 40, collectively, in the plane of the top surface 12a are nominally equal to the dimensions (length and width) of the single crystal section 29 of layer 20. The lateral location of edge 30 determines the location of the facets 44. By placing the edge 30 over the trench isolation regions 12 and exterior of the sidewalls 14, the facets 44 can be laterally displaced to a position in space outside of the area of the active device region and overlying the trench isolation regions 12.

Figure 7:
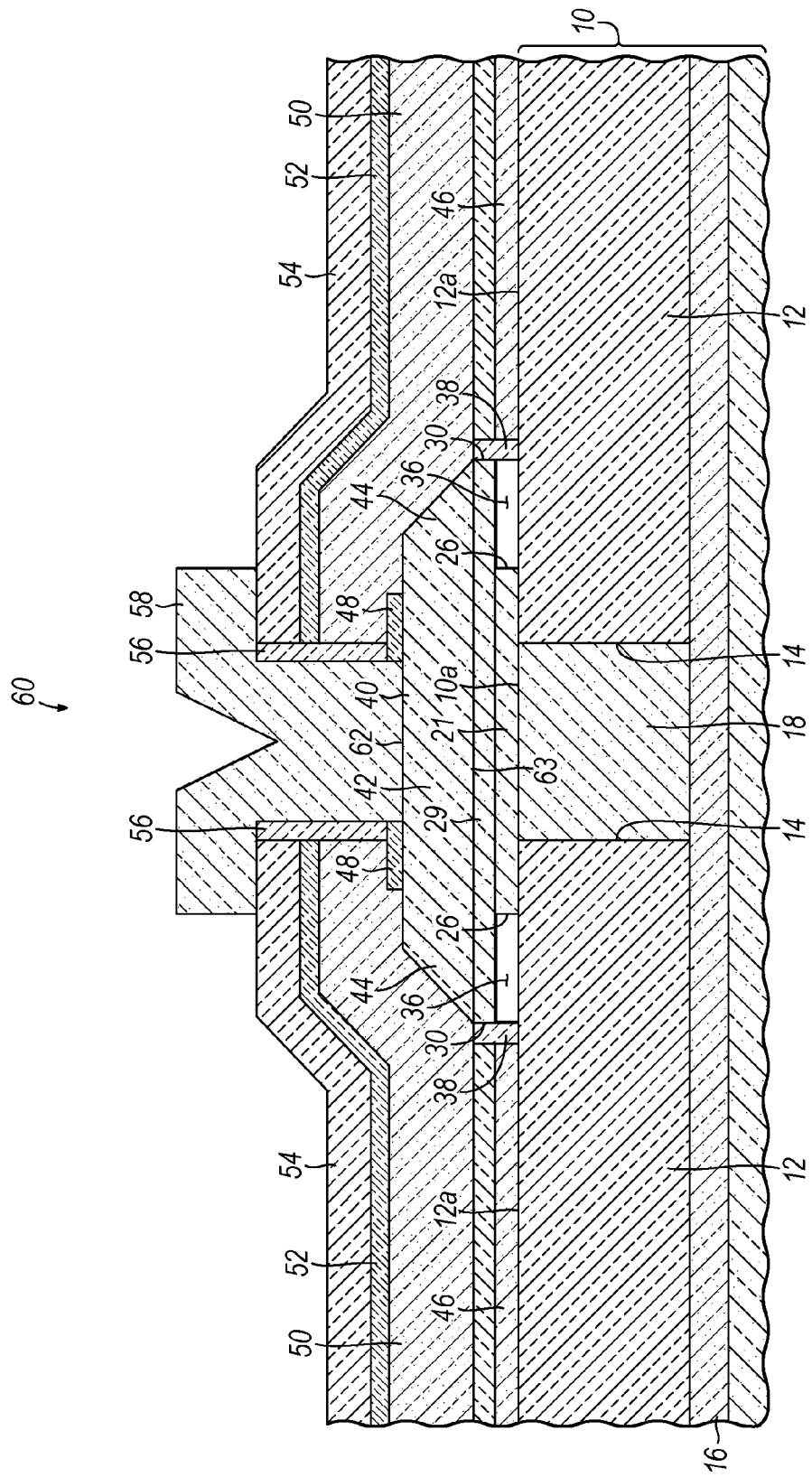

With reference to FIG. 7 in which like reference numerals refer to like features in FIG. 6 and at a subsequent fabrication stage of the processing method, a dielectric layer 48 is applied and patterned to leave a pad at the intended location of an emitter and an opening to the intrinsic base layer 40. An extrinsic base layer 50 is formed that is coupled through the opening in the dielectric layer 48 with the intrinsic base layer 40. In one embodiment, the extrinsic base layer 50 may be comprised of polycrystalline semiconductor material (e.g., polysilicon or polycrystalline SiGe deposited by CVD process. If the extrinsic base layer 50 is comprised of SiGe, the concentration of Ge may have a graded or an abrupt profile and may include additional layers, such as a Si cap layer and/or a Si bottom layer. The extrinsic base layer 50 may be in situ doped with a concentration of a dopant, such as an impurity species from Group III of the Periodic Table (e.g., boron) effective to impart p-type conductivity and may be optionally doped with carbon. As a consequence of the crystalline state of the single crystal section 42 of intrinsic base layer 40, the extrinsic base layer 50 may be comprised of single crystal semiconductor material that relies on the semiconductor material of the intrinsic base layer 40 as a growth seed.

Dielectric layers 52, 54 may then be formed on the extrinsic base layer 50. Dielectric layer 52 may be comprised of an electrical insulator such as silicon nitride ($Si_3N_4$) deposited using CVD. Dielectric layer 54 may be comprised of a different electrical insulator such as silicon dioxide ($SiO_2$) deposited using CVD.

Dielectric layers 52, 54 are patterned using photolithography and etching processes to define an emitter opening aligned with the collector 18. To that end, a patterned etch mask (not shown) is applied to the dielectric layer 54. In one embodiment, the etch mask may be a photoresist layer comprised of a sacrificial organic material applied by spin coating to dielectric layer 54. The photolithography process that patterns the photoresist layer exposes the photoresist to radiation imaged through a photomask and develops the resulting latent feature pattern in the exposed photoresist to define a window at the intended location for the emitter opening. The etching process relies on an etch chemistry effective to remove the material of the dielectric layers 52, 54 within the window and stops on the extrinsic base layer 50. After the window is formed, the etch mask is removed. If comprised of photoresist, the etch mask may be removed by oxygen plasma ashing or chemical stripping.

The opening is extended by a controlled etching process, such as RIE, through the thickness of the extrinsic base layer 50 using the patterned dielectric layers 52, 54 as a hardmask. Non-conductive spacers 56 are formed inside the emitter opening and extend vertically to the base of the emitter opening. The spacers 56 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces.

The emitter opening is extended through the pad defined by dielectric layer 48 and an emitter 58 of a heterojunction bipolar transistor 60 is formed in the emitter opening. The emitter 58 may be formed from a layer of semiconductor material that is deposited and then patterned using lithography and etching processes. The lithography process may utilize photoresist and photolithography to form an etch mask that protects only a strip of the semiconductor material registered with the emitter opening. An etching process that stops on the material of layer 54 is selected to fashion the emitter 58 from the protected strip of semiconductor material. The etch mask is subsequently removed.

The emitter 58 is electrically and physically coupled with the intrinsic base layer 40. The bottom part of the emitter 58 directly contacts the top surface of intrinsic base layer 40 along a junction 62. A head of the emitter 58 protrudes out of the emitter opening. The non-conductive spacers 56 encircle or surround the emitter 58 so that the emitter 58 is electrically isolated from the extrinsic base layer 50.

The emitter 58 of the heterojunction bipolar transistor 60 may be formed from a layer of a heavily-doped semiconductor material that is deposited and then patterned using lithography and etching processes. For example, the emitter 58 may be comprised of polysilicon or polycrystalline silicon-germanium deposited by CVD or LPCVD and heavily doped with a concentration of a dopant, such as an impurities species from Group V of the Periodic Table, such as phosphorus (P), arsenic (As), to impart n-type conductivity. The heavy-doping level reduces the resistivity of the polysilicon or polycrystalline silicon-germanium, and may be introduced by in situ doping that adds a dopant gas, such as phosphine or arsine, to the CVD reactant gases.

The dielectric layers 52, 54, intrinsic base layer 40, and extrinsic base layer 50 may be lithographically patterned using one or more etch masks and etching processes, such as RIE, with suitable etch chemistries. The patterning of the extrinsic base layer 50 and intrinsic base layer 40 respectively define an extrinsic base and an intrinsic base of the heterojunction bipolar transistor 60.

The intrinsic base of the heterojunction bipolar transistor 60 comprises the section 42 of intrinsic base layer 40 on the single crystal section 29. The section 42 of the intrinsic base layer 40 is coterminous with the edge 30 of the single crystal section 29. The collector 18 may also be considered to include the single crystal section 21 of layer 20 and the single crystal section 29 of layer 28. The width, $w_2$, of the collector 18 in the substrate 10 may be optimized to reduce the collector-base parasitic capacitance. The section 42 of the intrinsic base layer 40 has a width approximately equal to the width, $w_3$, of the single crystal section 29, which is larger than the width, $w_2$, of the collector 18. A junction 63 is defined at the interface between the collector 18 and the single crystal section 29.

The heterojunction bipolar transistor 60 has a vertical architecture in which the intrinsic base is located between the emitter 58 and the collector 18, and the emitter 58, the intrinsic base, and the collector 18 are vertically arranged. The conductivity type of the semiconductor material constituting the emitter 58 and the collector 18 is opposite to the semiconductor material constituting the intrinsic base layer 40. The extrinsic base layer 50 is coupled with section 42 of the intrinsic base layer 40 and is located peripheral to the emitter 58.

Standard silicidation and standard middle-end-of-line (MEOL) and back-end-of-line (BEOL) processing follows, which includes formation of contacts and wiring for the local interconnect structure overlying the heterojunction bipolar transistor 60, and formation of dielectric layers, via plugs, and wiring for an interconnect structure coupled by the interconnect wiring with the heterojunction bipolar transistor 60, as well as other similar contacts for additional device structures like heterojunction bipolar transistor 60 and CMOS transistors included in other circuitry fabricated on the substrate 10. Other active and passive circuit elements, such as diodes, resistors, capacitors, varactors, and inductors, may be integrated into the interconnect structure and available for use in the BiCMOS integrated circuit.

Figure 8:
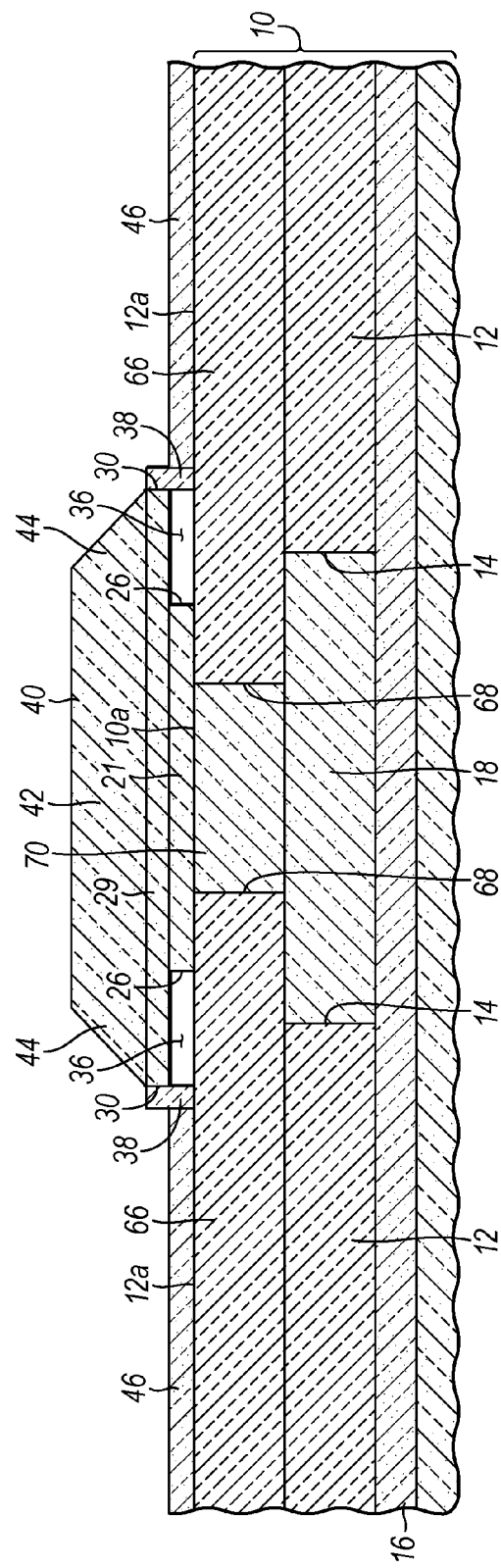
FIG. 8 is a cross-sectional view similar to FIG. 6 of a device structure in accordance with an alternative embodiment of the invention.

With reference to FIG. 8 in which like reference numerals refer to like features in FIG. 6 and in accordance with an alternative embodiment, a dielectric layer 66 may be deposited on top surface 10a of the substrate 10 and on the top surface 12a of the trench isolation regions 12 before layer 20 is formed. The dielectric layer 66 is patterned with photolithography and etching processes to define a trench or opening 68 that extends to the top surface 10a of substrate 10 and that is aligned with the collector 18. The dimensions (i.e., the width and length) of the opening 68 can be adjusted to optimize the reduction in the collector-base parasitic capacitance.

A fill plug 70 comprised of a semiconductor material is formed in opening 68 by a selective epitaxial growth (SEG) process. In the representative embodiment, the fill plug 70 fully occupies the opening 68. The semiconductor material of substrate 10 operates as a seed crystal or crystalline seed that establishes a crystallographic pattern for the semiconductor material in fill plug 70 in which the crystallographic pattern of substrate 10 is reproduced so that fill plug 70 and the substrate 10 nominally have the same lattice structure and crystalline orientation. The SEG process may be conducted at a subatmospheric process pressure (e.g., 40 torr) and typically with the substrate 10 heated to a temperature between about 450° C. and about 1050° C.

The semiconductor material comprising the fill plug 70 may be silicon, silicon-germanium, or silicon-carbon, which may be doped to have a specific conductivity type such as the same conductivity type as the semiconductor material of the substrate 10. In one embodiment, the fill plug 70 may be in situ doped during growth with an impurity species from Group V of the Periodic Table (e.g., phosphorus (P) or arsenic (As)) so that the fill plug 70 has n-type conductivity.

The sequence of the process flow continues as described in FIGS. 1-6. During the thermal realignment process, the single crystal semiconductor material of the fill plug 70 functions as a growth seed for the single crystal section 21 of layer 20, which acquires the crystal structure and orientation of the fill plug 70. After the intermediate structure of FIG. 8 is produced, the sequence of the process flow then continues as described above with regard to FIG. 7 to produce the heterojunction bipolar transistor 60.

Figure 9:
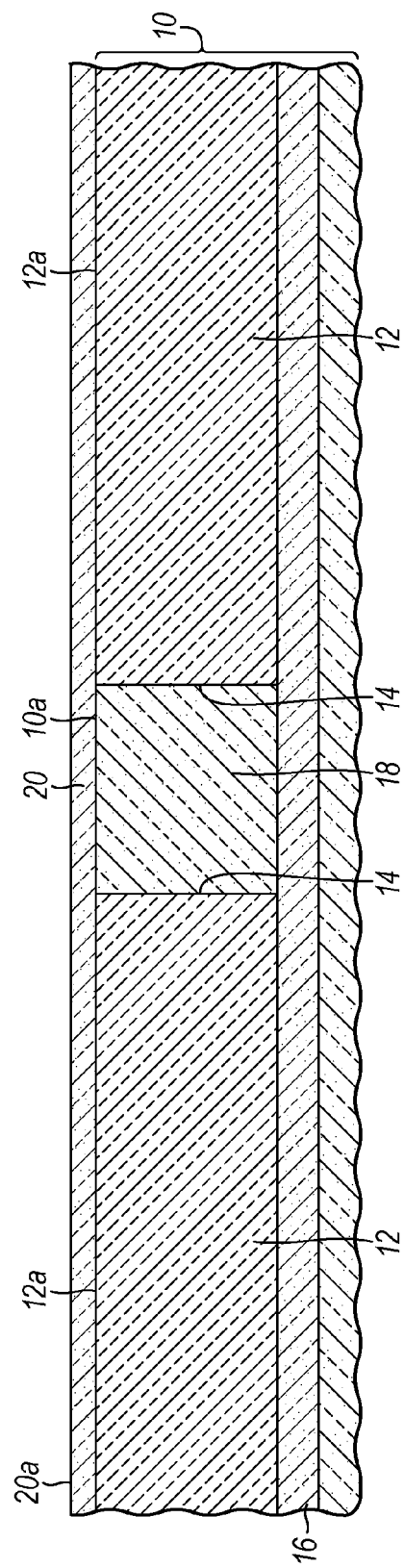
FIGS. 9-11 are cross-sectional views of a portion of a substrate at successive fabrication stages of a processing method for fabricating a device structure in accordance with an alternative embodiment of the invention.

With reference to FIG. 9 in which like reference numerals refer to like features in FIG. 1 and in accordance with an alternative embodiment, the top surface 10a of substrate 10 may be cleaned to, for example, remove native oxide. The blanket layer 20 is deposited on the cleaned top surface 10a of the substrate 10 and on a top surface 12a of the trench isolation regions 12. Without forming a mask on the top surface 20a of layer 20, the ions 24 (FIG. 1) are introduced using ion implantation into layer 20. As a result, the entire layer 20 acquires a modified composition from the ion implantation, such as a modification adding Ge to a layer comprised of silicon. The element introduced into the implanted section 23 of layer 20 has a concentration effective to provide an etch rate greater than an etch rate of the single crystal section 29 of the layer 28 that is subsequently formed.

In an alternative embodiment, layer 20 may be deposited with the modified composition as opposed to depositing layer 20 and then modifying the composition through ion implantation. For example, the semiconductor material of layer 20 may comprise SiGe with a composition that is primarily silicon, which may be undoped, may include an n-type dopant, or may include a p-type dopant. The concentration of the minority element in layer 20 (e.g., Ge) is effective to provide an etch rate greater than an etch rate of the single crystal section 29 of the layer 28 that is subsequently formed.

Figure 10:
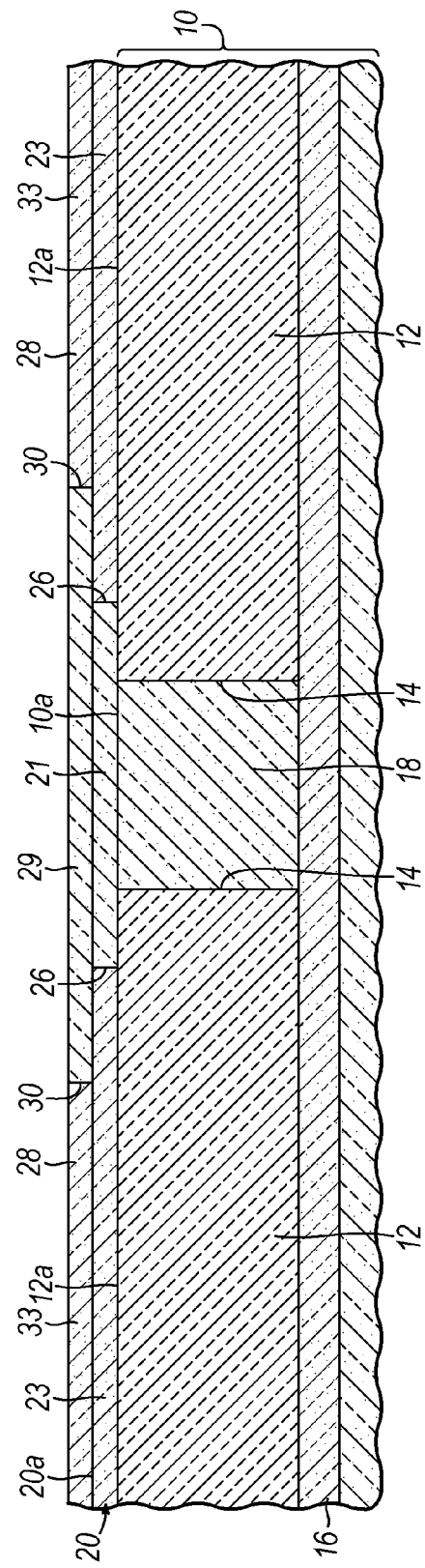

With reference to FIG. 10 in which like reference numerals refer to like features in FIG. 9 and at a subsequent fabrication stage of the processing method, layer 28 is deposited on layer 20 as described above in connection with FIG. 2. Next, the alignment process for layers 20 and 28 is performed as described above in connection with FIG. 3. Specifically, layers 20 and 28 are thermally annealed to produce the single crystal section 21 of layer 20 and the single crystal section 29 of layer 28.

Figure 11:
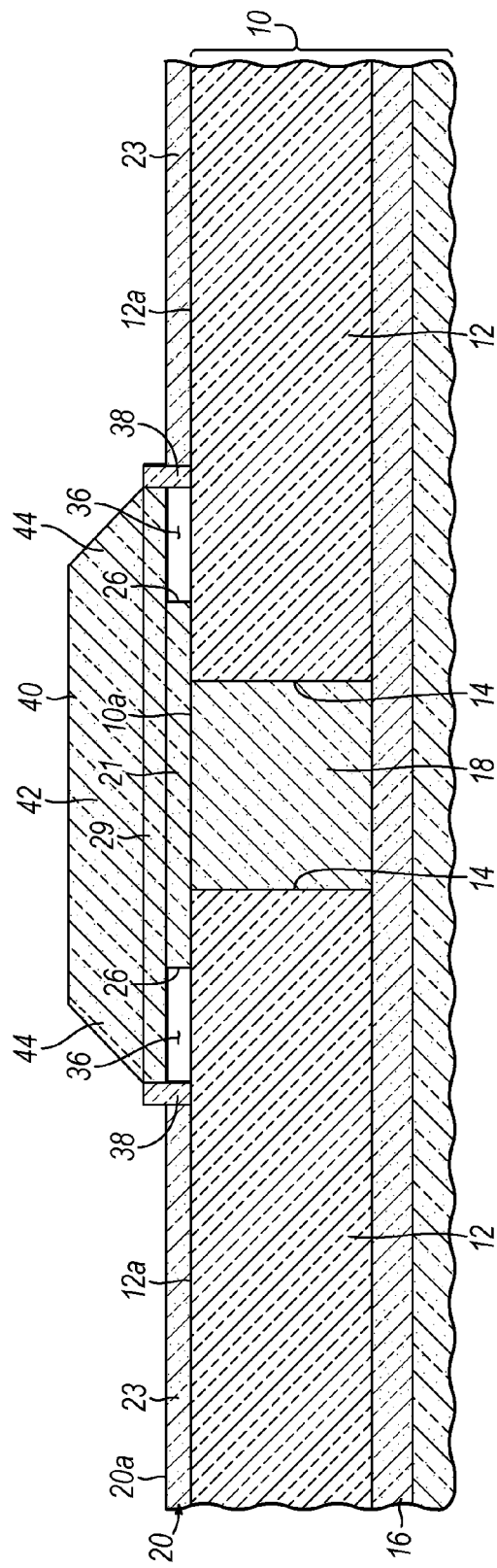

With reference to FIG. 11 in which like reference numerals refer to like features in FIG. 10 and at a subsequent fabrication stage of the processing method, the sequence of the process flow continues as described in FIGS. 4-6 to form the cavity 36, at least one spacer 38, and intrinsic base layer 40. In one embodiment, the etching process used to define the cavity 36 may be timed to establish a location for edge 26 by preventing or limiting the removal of the single crystal section 21 of layer 20. After the intermediate structure of FIG. 11 is produced, the sequence of the process flow then continues as described above with regard to FIG. 7 to produce the heterojunction bipolar transistor 60.

Figure 12:
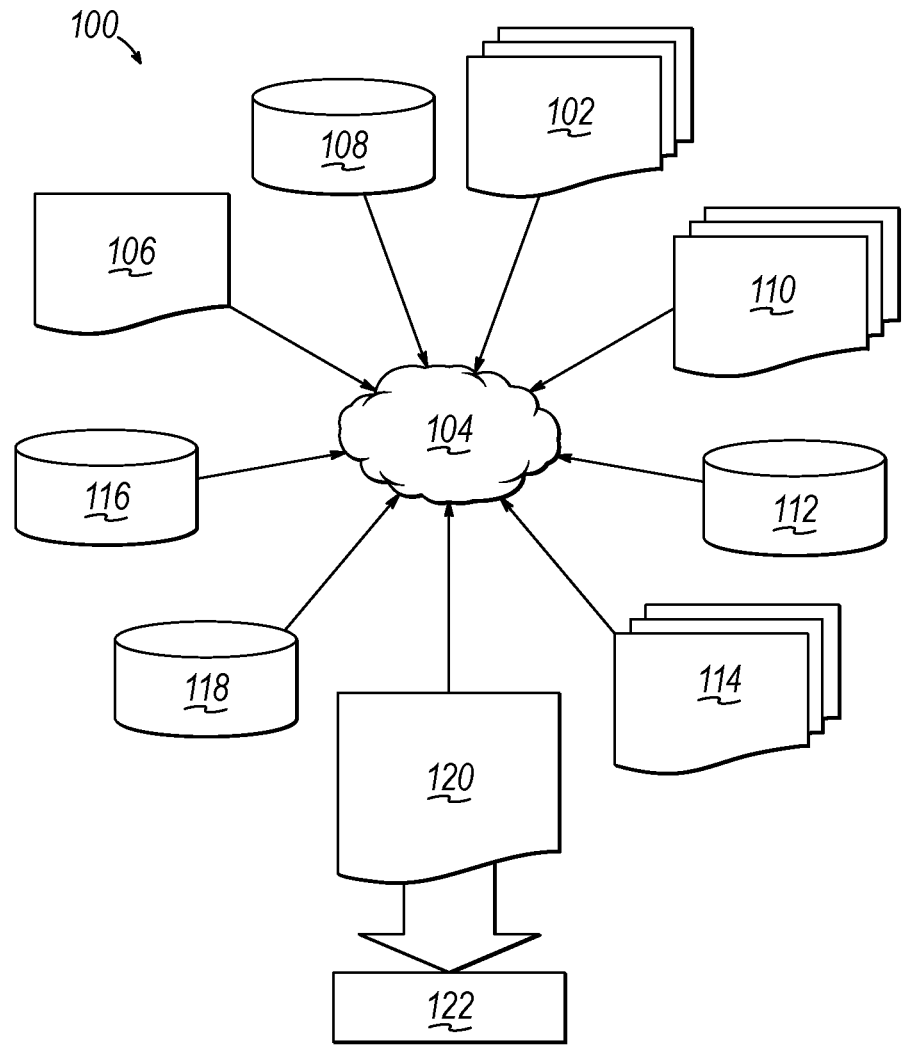
FIG. 12 is a flow diagram of a design process used in semiconductor design, manufacture, and/or test.

FIG. 12 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-11. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 120 may comprise a compiled, executable HDL simulation model that functionally simulates the devices shown in FIGS. 1-11.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a heterojunction bipolar transistor, the device structure formed using a semiconductor substrate, the device structure comprising:
   a trench isolation region in the semiconductor substrate;
   a collector in the semiconductor substrate and coextensive with the trench isolation region, the collector having a first width;
   a first semiconductor layer including a section disposed on the collector and on the trench isolation region, the section of the first semiconductor layer comprised of a first single crystal semiconductor material and having a second width greater than the first width;
   a second semiconductor layer including a section disposed on the section of the first semiconductor layer, the section of the second semiconductor layer comprised of a second single crystal semiconductor material, having an outer edge that overlies the trench isolation region, and having a third width greater than the second width; and
   a cavity extending laterally beneath the section of the second semiconductor layer from the outer edge of the section of the second semiconductor layer to the section of the first semiconductor layer.

2. The device structure of claim 1 further comprising:
   at least one spacer positioned at the outer edge of the section of the second semiconductor layer, the at least one spacer extending from the trench isolation region to the section of the second semiconductor layer to close an entrance to the cavity.

3. The device structure of claim 2 comprising:
   an intrinsic base layer including a single crystal first section and a non-single crystal second section, the first section of the intrinsic base layer conterminous with the outer edge of the section of the second semiconductor layer, and the first section of the intrinsic base layer coupled by the section of the first semiconductor layer and the section of the second semiconductor layer with the collector.

4. The device structure of claim 3 wherein the intrinsic base layer further includes a non-single crystal second section that is located on the trench isolation region adjacent to the at least one spacer and that cooperates with the at least one spacer to close the entrance to the cavity.

5. The device structure of claim 1 comprising:
   an intrinsic base layer including a single crystal section conterminous with the outer edge of the section of the second semiconductor layer, the single crystal section of the intrinsic base layer coupled by the section of the first semiconductor layer and the section of the second semiconductor layer with the collector.

6. The device structure of claim 5 further comprising:
   a dielectric layer on a top surface of the collector and a top surface of the trench isolation region, the dielectric layer includes an opening that extends vertically to the intrinsic base layer and that has a fourth width that is less than the first width of the collector; and
   a semiconductor plug in the opening, the semiconductor plug having an epitaxial relationship with the intrinsic base layer and with the collector.

7. The device structure of claim 6 further comprising:
   an emitter coupled by the section of the intrinsic base layer with the collector; and
   an extrinsic base layer coupled with the intrinsic base layer and located peripheral to the emitter.

8. A design structure readable by a machine used in design, manufacture, or simulation of an integrated circuit, the design structure comprising:
   a trench isolation region in a semiconductor substrate;
   a collector in the semiconductor substrate and coextensive with the trench isolation region, the collector having a first width;
   a first semiconductor layer including a section disposed on the collector and on the trench isolation region, the section of the first semiconductor layer comprised of a first single crystal semiconductor material and having a second width greater than the first width;
   a second semiconductor layer including a section disposed on the section of the first semiconductor layer, the section of the second semiconductor layer comprised of a second single crystal semiconductor material, having an outer edge that overlies the trench isolation region, and having a third width greater than the second width; and
   a cavity extending laterally beneath the section of the second semiconductor layer from the outer edge of the section of the second semiconductor layer to the section of the first semiconductor layer.

9. The design structure of claim 8 wherein the design structure comprises a netlist.

10. The design structure of claim 8 wherein the design structure resides on storage medium as a data format used for the exchange of layout data of integrated circuits.

11. The design structure of claim 8 wherein the design structure resides in a programmable gate array.

* * * * *